(12) United States Patent
Wilner

(10) Patent No.: US 8,115,265 B2
(45) Date of Patent: Feb. 14, 2012

(54) INTERCONNECTION SYSTEM ON A PLANE ADJACENT TO A SOLID-STATE DEVICE STRUCTURE

(75) Inventor: Leslie Bruce Wilner, Palo Alto, CA (US)

(73) Assignee: Meggitt (San Juan Capistrano), Inc., San Juan Capistrano, CA (US)

( * ) Notice: Subject to any disclaimer, the term of this patent is extended or adjusted under 35 U.S.C. 154(b) by 338 days.

(21) Appl. No.: 12/411,582

(22) Filed: Mar. 26, 2009

(65) Prior Publication Data

US 2009/0261432 A1   Oct. 22, 2009

Related U.S. Application Data

(60) Provisional application No. 61/039,646, filed on Mar. 26, 2008.

(51) Int. Cl.
*H01L 27/14* (2006.01)

(52) U.S. Cl. .................. 257/414; 257/E27.001

(58) Field of Classification Search .......... 257/414–420, 257/E27.001
See application file for complete search history.

(56) References Cited

U.S. PATENT DOCUMENTS

| | | | |
|---|---|---|---|
| 4,825,335 A | 4/1989 | Wilner | |
| 6,433,411 B1 | 8/2002 | Degani et al. | |
| 6,661,070 B2 * | 12/2003 | Zosel et al. | 257/420 |
| 2005/0076719 A1 | 4/2005 | Jakobsen et al. | |
| 2005/0205951 A1 * | 9/2005 | Eskridge | 257/416 |
| 2006/0199365 A1 * | 9/2006 | Wilner | 438/618 |
| 2008/0265408 A1 * | 10/2008 | Kaufmann et al. | 257/723 |

* cited by examiner

*Primary Examiner* — Ha Tran T Nguyen
*Assistant Examiner* — Kevin Quinto
(74) *Attorney, Agent, or Firm* — Paul Davis; Goodwin Procter LLP

(57) ABSTRACT

An interconnection system is provided for a solid-state device. The solid-state that includes, a first layer, multiple devices and a first face. A second layer is bonded to the first face at a bonded face of the second layer that faces the first face. Electrically conductive bonds are between the first and second faces. Conductive paths are on the bonded face of the second layer and connect two or more of the conductive bonds.

8 Claims, 8 Drawing Sheets

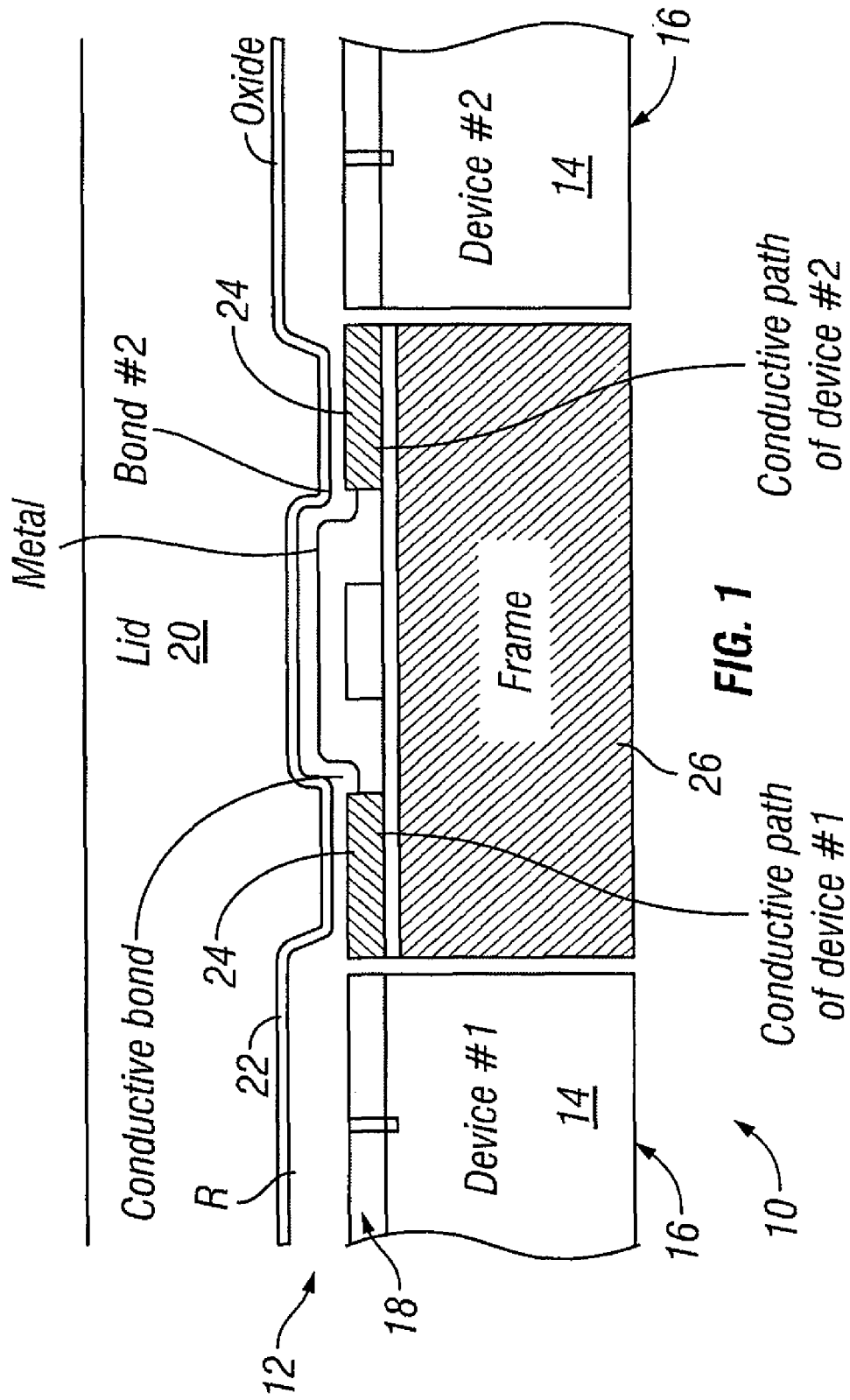

INTERCONNECTION SYSTEM ON A PLANE ADJACENT TO A SOLID-STATE DEVICE STRUCTURE

CROSS-REFERENCE TO RELATED APPLICATIONS

This application claims the benefit of U.S. Ser. No. 61/039,646, filed Mar. 26, 2008, which application is fully incorporated herein by reference.

BACKGROUND OF THE INVENTION

1. Field of the Invention

This invention relates generally to interconnection systems and, in particular, to interconnection systems for solid-state devices.

2. Description of the Related Art

Microelectromechanical systems (MEMS) often include integrated electrical and mechanical components that require, respectively, electrical interconnections and mechanical couplings. MEMS fabrication techniques, such as deep reactive ion etching (DRIE) can produce complex three dimensional structures with components that are difficult to interconnect. MEMS devices may include regions that are completely etched through from a top surface to a bottom surface of a semiconductor wafer, such that a conventional via-connected, multi-planar interconnect system within a device substrate is not feasible.

For example, a conventional, full-bridge accelerometer with cantilevered seismic masses and strain gauges can be fabricated as a MEMS structure, but the electrical connection of the bridge requires complicated crossover structures or very delicate wire-bonding on a device that may be on the order of 1 millimeter across. The interconnection problem may be exacerbated when multiple devices are fabricated on a single MEMS substrate, such as a tri-axial accelerometer, for example, where several crossover structures may be required and multiple wire bonds must be made to the MEMS device and to contacts that provide external access to the MEMS device, such as a lead frame. Additionally, wire bonds may reduce the reliability of a MEMS device in harsh temperature, shock and vibration environments such as automotive and military applications.

A Wheatstone bridge on the surface of a MEMS device is connected by through-wafer-vias to terminals on the outside surface of a wafer bonded to the MEMS wafer. As an alternative to wafer vias, leads are brought out horizontally. This requires an insulating bond on the outside.

Accordingly, there is a need for a MEMS packaging that provides interconnections without on-device crossovers and bond wires. There is a further need for MEMS packaging that connects two or more points on a MEMS wafer with conductive paths on the inside of an opposing second wafer.

SUMMARY OF THE INVENTION

An object of the present invention is to provide a interconnection system for a solid state device that provides interconnections without on-device crossovers and bond wires.

Another object of the present invention is to provide an interconnection system for a solid state device connects two or more points on a solid state device wafer with conductive paths on the inside of an opposing second wafer.

A further object of the present invention is to provide an interconnection system for a MEMS device that minimizes the amount of surface on a sensor wafer used for wiring, to keep the total surface small.

Yet another object of the present invention is to provide an interconnection system for a MEMS device that uses an unused surface on an inside of a protective cover wafer for wiring.

These and other objects of the present invention are achieved in, an interconnection system for a solid-state device. The solid-state that includes, a first layer, multiple devices and a first face. A second layer is bonded to the first face at a bonded face of the second layer that faces the first face. Electrically conductive bonds are between the first and second faces. Conductive paths are on the bonded face of the second layer and connect two or more of the conductive bonds.

In another embodiment of the present invention, an interconnection system for a MEMS device, with contact points, includes a silicon substrate with a face surface that has a pattern of recesses which define functional elements of the MEMS device, leaving sharp-edged, highly doped ridges. A cover is provided with a mating surface coupled to the face surface. The cover includes patterns of metal films that engage the ridges to form connections from the face surface to the patterns of metal film on the mating surface.

BRIEF DESCRIPTION OF THE DRAWINGS

FIG. 1 is a diagram illustrating one embodiment of an interconnection system for a solid-state device of the present invention.

DETAILED DESCRIPTION OF THE PREFERRED EMBODIMENTS

Figure 2A:
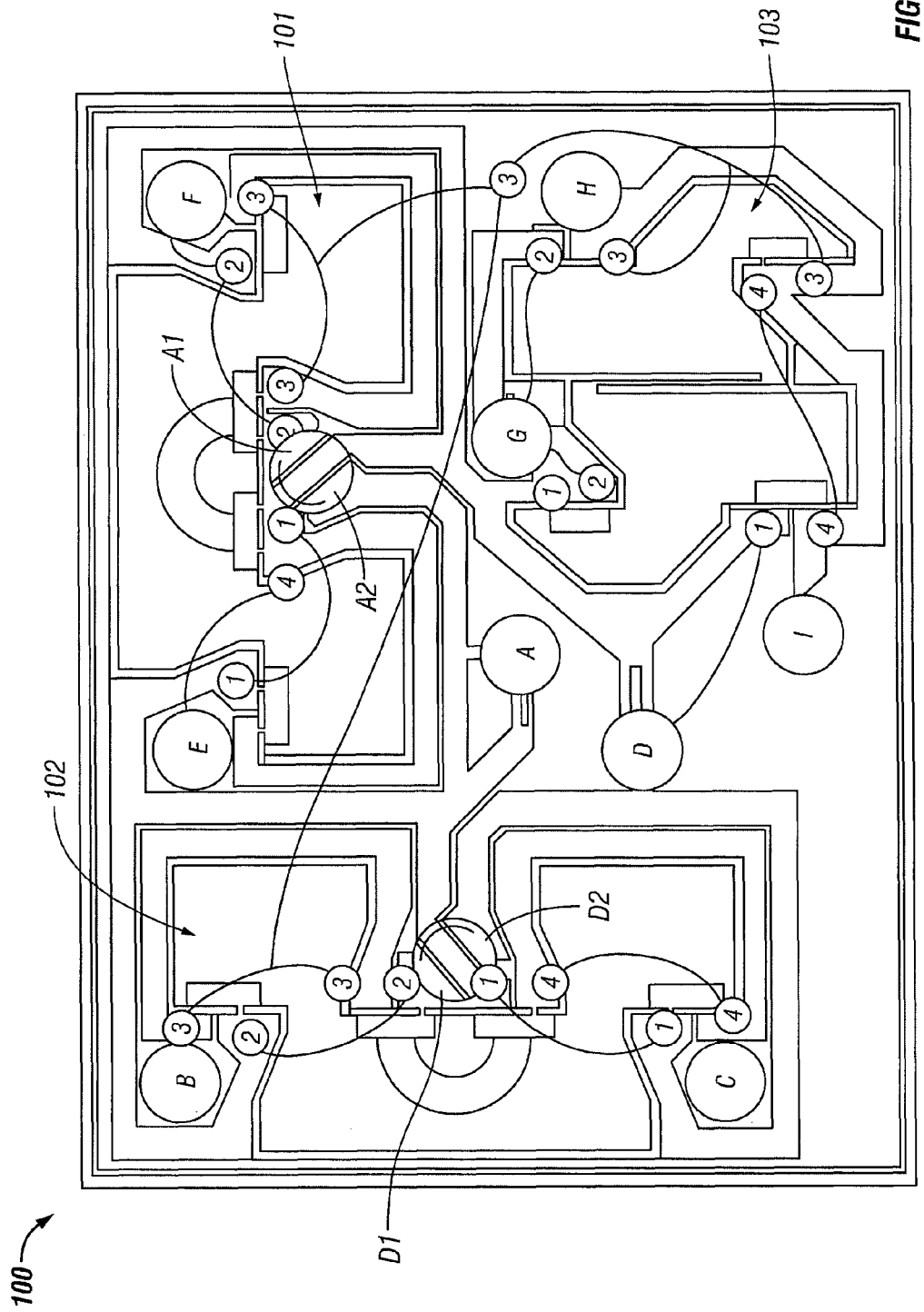
FIG. 2A illustrates a MEMS device according to one embodiment of the invention.

In one embodiment of the present invention, an interconnection system is provided for solid-state devices. Solid-state devices include but not limited to, accelerometers, pressure sensors, resonators and relays. The accelerometer can be, (i) single axis, linear, (ii) single axis, rotational, (iii) two-axis, (iv) three axis, (v) x-axis, rotational and linear, (vi) piezoresistive and (vii) variable capacitance. The interconnection system can be for any type of semiconductor device or semiconductor technology requiring interconnections that cannot be achieved in a single plane or interconnections that cannot be achieved using conventional vias and multiple interconnection planes within a single multilayer substrate. The advantage of the present invention is that much of a formerly little-use surface becomes available for use as a printed-wire board.

The present invention is applicable to any device in which two or more wafers are bonded together, and is particularly applicable where the bonding means is conductive. This includes purely electronic integrated circuits which are sealed to protective covers with through-wafer-vias for flip-chip mounting.

The present invention can be used for any MEMS material. With the present invention, cross-overs on the surface of the MEMS device are substantially eliminated and the cross-overs are on the opposing the second plane.

Referring to FIG. 1, in one embodiment of the present invention, an interconnection system for a solid-state device 10 is provided. The solid-state device 12 includes, a first layer 14, multiple devices 16 and a first face 18. A second layer 20 is bonded to the first face 18 at a bond face 22 of the second layer 20 that faces the first face 18. Electrically conductive bonds 24 are between the first face 18 and the bonded face 22. Conductive paths are on the bonded face 22 of the second layer 20 and connect two or more of the conductive bonds 24.

The solid state device 12 has a moveable portion that is moveable relative to an associated frame structure 26. Motion of the moveable portion is monitored to produce a signal. Motion of the moveable portion is not restrained by the second layer 20, and a corresponding area on the second layer 20 is available for electrical coupling. Conductive paths on the bonded face 22 include paths for cross overs for circuitry on the first face 18.

In one embodiment, the first layer 14 is silicon, and the second layer 20 is made of a material that matches the thermal expansion of silicon. By way of illustration, and without limitation, the second layer 20 is glass that is thermally expansion-matched to silicon.

A first conductive film is applied to the first face 18 and a second conductive film is applied to the bond face 22 to provide for a diffusion bond interface. Suitable conductive films include but not limited to, aluminum, tin, gold, silver or copper conductors.

In one embodiment, the first layer 14 has a pattern of silicon on an oxide layer. In another embodiment the second layer 20 is single crystal. A thickness of the first layer 14 can be from 0.5 micron to 4.0 microns.

In another embodiment of the present invention, an interconnection system for a MEMS device with contact points includes a silicon substrate with a face surface that has a pattern of recesses. The recesses define functional elements of the MEMS device and leave sharp-edged, highly doped ridges. A cover is provided with a mating surface coupled to the face surface. The cover includes patterns of metal films that engage the ridges to form connections from the face surface to the patterns of metal film on the mating surface. In one embodiment, the sharp edge have a radius of curvature at the edge that is no greater than 0.1 microns. In one embodiment, the ridges have a doping of at least $10^{19}$ boron atoms/$cm^3$.

The following embodiment of the present invention uses SOI. It will be appreciated that the present invention is applicable to junction isolated solid-state devices or integrated devices. In this embodiment, it is undesirable to stress the immediate area of a junction. The raised area of silicon to be pressed into the conductive layer, such as the daisy of FIG. 4D, is etched from a more extended paddle of heavily doped material (usually P+ in an N wafer) in the solid-state device.

In one embodiment, an interconnection system on a plane adjacent to a complex silicon-type device is a MEMS device comprising a micro-machined silicon substrate having a planar surface, a first oxide layer grown on the planar surface and a silicon layer on the first oxide layer, where the silicon layer is doped and selectively etched to define a planar configuration of silicon-on-insulator (SOI) conductors. The SOI conductors comprise one or more interconnection terminals, where each terminal comprises a plurality of fingers and each finger comprises a face substantially parallel to the planar surface and sidewalls substantially perpendicular to the face defining edges around each finger. The system also includes a cover configured for thermo-compression (TC) bonding to the solid-state device. The cover may include a silicon substrate having a micro-machined surface where the micro-machined surface comprises a plurality of lands and trenches.

The cover may also include a second oxide layer of substantially uniform thickness, grown on the micro-machined layer to conform to the plurality of lands and trenches, where the lands are configured to align with selected interconnection terminals of the solid-state device. The second oxide layer may also include one or more elevated flats.

A layer of conductive film may be selectively deposited on the second oxide layer to define a pattern of interconnections between the selected terminals such that when the solid-state device and the cover are aligned and TC bonded.

The basic elements of a suitable MEMS device of the present invention include, means to collect signals from external sources, e.g., a diaphragm to deflect in response to pressure or a seismic mass to resist an acceleration applied to the frame of the device, means to convert this physical input to an electrical change, e.g., change of capacitance or of resistance, and means to present the electrical change to external circuitry.

Each of the accelerometers includes one or more seismic masses that are configured to pivot around pivot axes defined by pivot points between the seismic masses and the body of the silicon substrate, silicon carbide, other piezoresistive conductive materials and the like, in which the seismic masses are formed. The seismic masses may be formed, for example, by deep reactive ion etching (DRIE which etches completely through the substrate except at the pivot points. Strain gauges are formed at the pivot points selectively doping the substrate to create piezoresistors that change resistance when the seismic masses pivot under acceleration. Functionally comparable sensors can be made by anisotropic wet etching.

In one embodiment each of the accelerometers in solid-state device 100 is designed to function like a Wheatstone bridge. A wheatstone bridge can be wired in a single plane. For example, the Z-axis sensor 103 has its resistors arranged for easy wiring, alternating the sense of the resistance change of the resistors around the bridge, increasing, decreasing, increasing, decreasing. Where it is necessary to have two resistors with the same sense of change physically adjacent, as in the X and Y sensors 101 and 102, it becomes necessary to have crossovers, to twist the wires, to have the sense of change alternate around the bridge.

The incorporation of three full bridges with common power source into a singe device might be accomplished without additional crossings. This could be done, for example, by having +power along one edge and −power along the opposite edge, and all the six signal terminals exiting the interior. Offering cross-overs as an option may permit closer packing of the three devices.

Conventionally, terminals A, B, C, D1 and D2 of accelerometer 102, terminals A1, A2, D, E and F of accelerometer 101 and terminals G, H and I of accelerometer 103 would have to be wired up with wire bonds to facilitate crossovers as partially illustrated in FIG. 2A.

Figure 2B:
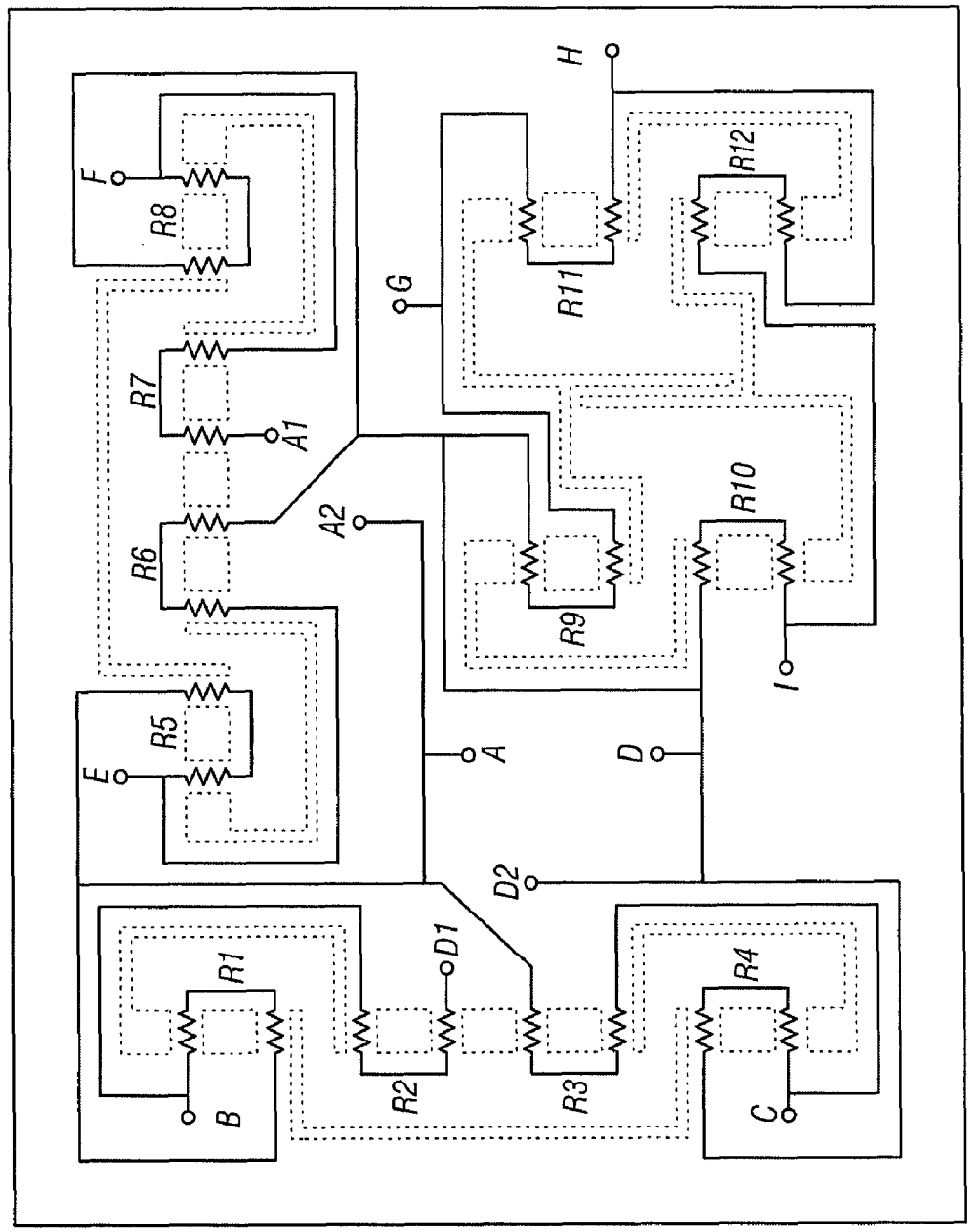
FIG. 2B is an electromechanical representation of the MEMS device illustrated in FIG. 2A.

FIG. 2B is a representation of MEMS device 100 illustrating both electrical and mechanical features. By way of illustration, in FIG. 2B, the seismic masses are the shaded areas and are separated from the body of the substrate by etched-thru openings The piezoresistive strain gauges are illustrated schematically by dual resistors R1 through R12. The dual resistors are used to keep terminals for the resistors on the immobile "frame" structure. If single resistors were used, they might be connected as half-bridges on the moving portion and their common point connected to the immobile frame via a mechanically soft link. The dual resistors provide electrical paths to and from the seismic masses so that all of the terminals can be located on the body of the substrate and not on the moving seismic masses.

Figure 2C:
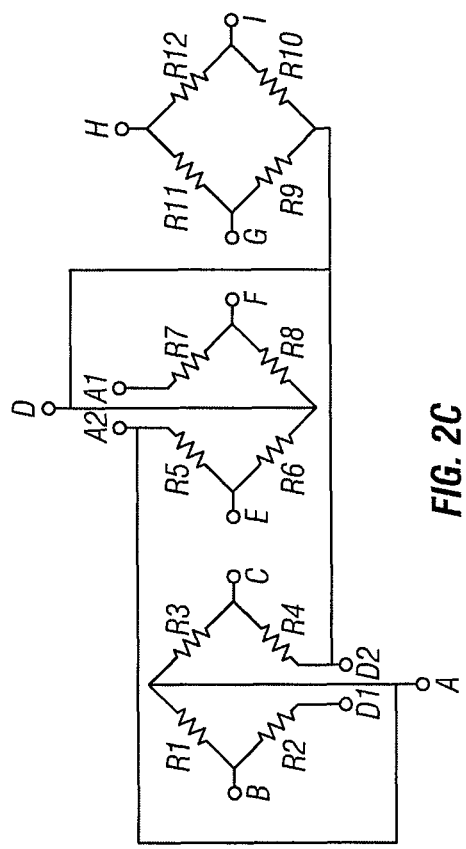
FIG. 2C is a schematic diagram of the MEMS device illustrated in FIG. 2A.
Figure 2D:
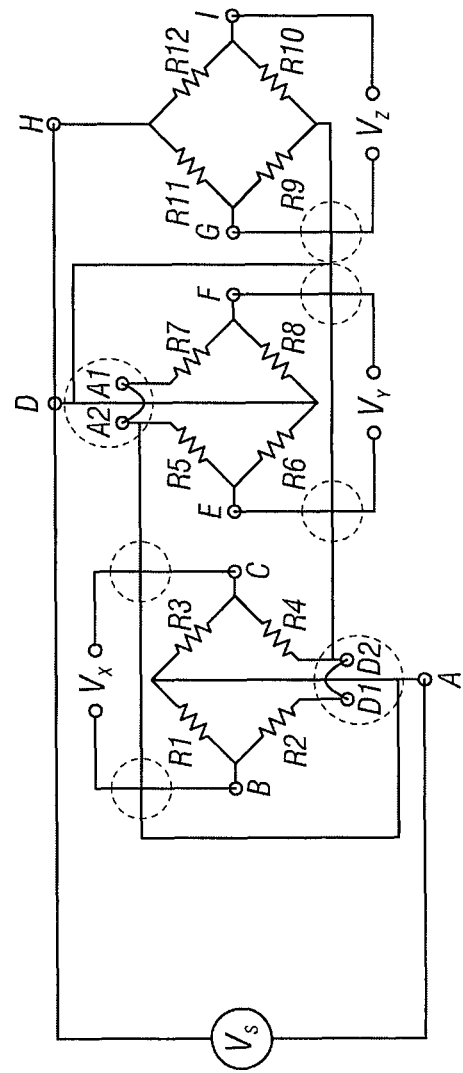
FIG. 2D is a schematic diagram the MEMS device of FIG. 2A illustrating the crossover wiring needed to implement functionality.

FIG. 2C is an electrical schematic diagram of the circuitry of MEMS device 100 illustrating how the Wheatstone bridges cannot be fully connected in a single plane. FIG. 2D illustrates how the bridges are wired to connect a voltage source $V_S$ to the three bridges and to have access to the three output voltages $V_X$, $V_Y$ and $V_Z$. As shown in FIG. 2D, seven different crossovers (indicated by broken circles) are needed.

Figure 3A:
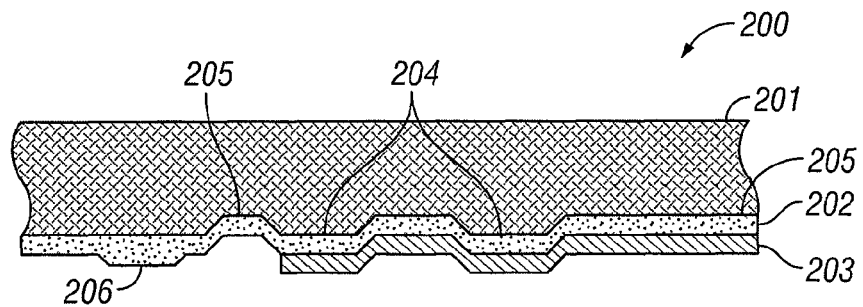
FIG. 3A illustrates a cross-section of a cover with an interconnection system according to one embodiment of the invention.
Figure 3B:
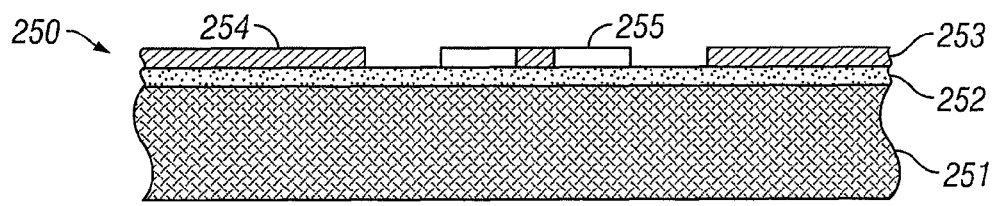
FIG. 3B illustrates a cross-section of a MEMS device according to one embodiment of the invention.

FIGS. 3A through 3D illustrate an interconnection system according to one embodiment of the present invention. As a non-limiting example, FIG. 3B is a cross-section of a MEMS device 250 fabricated as a silicon on insulator (SOI) device. Commercially available SOI uses silicon dioxide, but any insulator would serve. Insulator thickness ranges 0.2 to 3 microns.

The pattern of silicon on the oxide layer is necessarily made by a subtractive process, as it is important that the thin device layer be single crystal. The thickness of the device layer for this device ranges upward from 0.5 micron to 4.0 microns. Greater thickness is needed to give the gages resistance to buckling in compression.

Device 250 includes a silicon substrate 251 from which, for example, the body and seismic masses of an accelerometer may be formed. In one embodiment, an insulating layer 252 of silicon dioxide ($SiO_2$) is grown on the silicon substrate. In one embodiment, insulating layer 252 may have a thickness of approximately 0.5 microns. A pattern of doped-silicon conductors may then be formed on the oxide layer, using either additive or subtractive photolithographic processes as are known in the art and semiconductor fabrication techniques such as diffusion and ion implantation. In one embodiment, the silicon conductors may be approximately 0.5 microns thick and may include simple conductive traces, such as traces 253 and 254, and terminals, such as terminal 255, described in greater detail below.

FIG. 3A is a cross-section of a cover in one embodiment of the present invention that may be used to interconnect solid-state device 250. Cover 200 includes a silicon substrate 201 having a contoured surface with a pattern of lands 204 and trenches 205. In FIG. 3A the contouring of the surface permits the "connecting" portions of the metal traces on wafer 200 to be penetrated by select areas of the flat surface of the device layer, while the "cross-over" portions are well separated from the device layer. Although SOI is used in the exemplary device, it is not necessary for the present invention. Contouring might be 1 to 3 microns, enough to provide clearance, not so much as to interfere with photoresist processes.

The surface may be contoured using potassium hydroxide (KOH) etching or other such processes known in the art. The depth of contouring is 1) deep enough to insure that crossover conductors in the cover do not contact the SOI conductors on the complex silicon substrate when the cover and complex silicon substrate are joined, and 2) shallow enough to allow photolithographic patterning in subsequent metallization steps described below. In one embodiment, the depth of contouring may be approximately 1.7 microns.

After surface contouring, a relatively uniform layer of silicon dioxide is grown on the contoured surface, such that the depth of contouring is preserved. The thickness of the oxide layer may be approximately 0.5 microns. In selected areas, such as area 206, an additional thickness of oxide (e.g., 0.3 microns) may be grown as described in greater detail below, to function as "bond stops" that limit the depth of engagement of the cover and the complex silicon substrate when the two parts are joined.

After the oxide layer 202 is formed, a pattern of a conductive film 203 is formed on the oxide layer by either additive or subtractive photolithographic processes and metal deposition processes including but not limited to sputtering, CVD, and the like. As in the case of the oxide layer, the thickness of the conductors is relatively uniform to preserve the depth of contouring. In one embodiment, the conductor layer may be approximately 0.5 microns thick. When an oxide is in two thicknesses it is generally achieved in two oxidations. After a first oxidation, all oxide except in the "thick" area is removed. A second oxidation provides the thinner oxide.

The conductors are configured to follow the trenches 204 in areas where they are to form crossovers, and to terminate on lands 205 where they are to make electrical contact with terminals, such as terminal 255. This reinforces the an element of the present invention that there are areas which connect and areas that remain well out of contact.

Figure 3C:
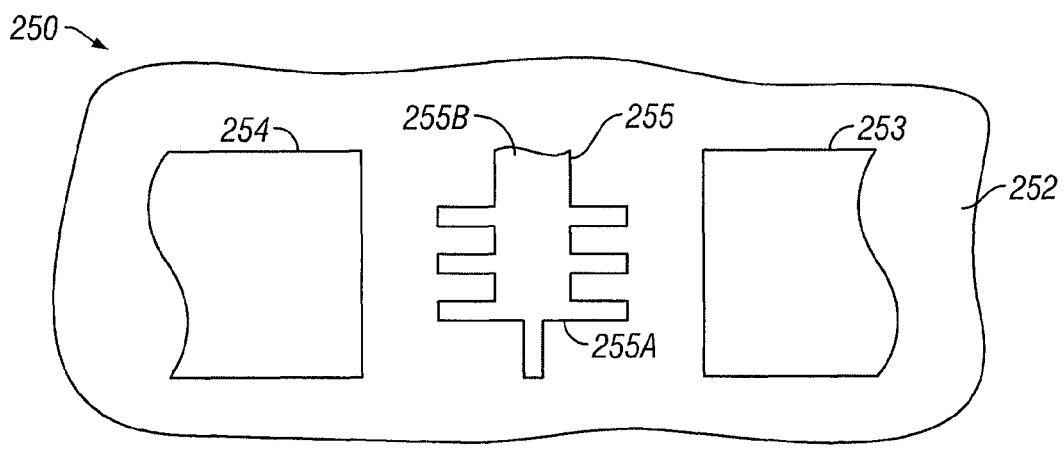
FIG. 3C is a top view of the MEMS device of FIG. 3B illustrating an interconnection terminal according to one embodiment of the invention.

FIG. 3C is a top view of complex silicon substrate 250 illustrating SOI traces 253 and 254, and SOI terminal 255. As illustrated in FIG. 3C, terminal 255 may have a tree-like configuration with a plurality of fingers 255A protruding from a "trunk" 255B. In this embodiment, the terminal fingers may be formed with substantially vertical sidewalls (e.g., by reactive ion etching) such that the edges of the fingers are relatively sharp. DRIE normally produces vertical walls and nearly square corners at the surface. Wet-etching can also provide sharp corners at the surface but does so by undercutting its mask, so more skill is needed to make the mask. To keep the edge sharp, oxidation is avoided after this patterning. Fingers of selected terminals are configured to break through a residual oxide layer on the layer of conductive film and bond with the layer of conductive film. The one or more flats may be configured to limit the depth of engagement of the fingers with the selected terminals to prevent contact between the layer of conductive film in the trenches and the silicon layer on the solid-state device.

The fingers are configured to engage conductive film conductors on the lands 204 of cover 200 when the two parts are joined, where the edges of the fingers are designed to break through any conductive film oxide film that forms on the conductive film and which would otherwise act as an insulating layer, preventing electrical contact between the terminals of the solid-state device and the conductive film conductors on the mating surface of the cover. If it is desired for thermocompression bonding, the silicon can penetrate from about 0.4 of the conductive film thickness to about 0.8 of the conductive film thickness into the conductive film. Conductive film can be applied by sputtering. The thickness of the conductive film can be about 0.5 micron to 1.6 microns.

The length of engagement of the fingers is selected to exceed any expected misalignment of the complex silicon substrate and the cover. In one embodiment, for example, the length of engagement may be approximately 13 microns. Finger width can be 2 to 8 microns. In one embodiment, the width of the fingers may be approximately six microns.

Figure 3D:
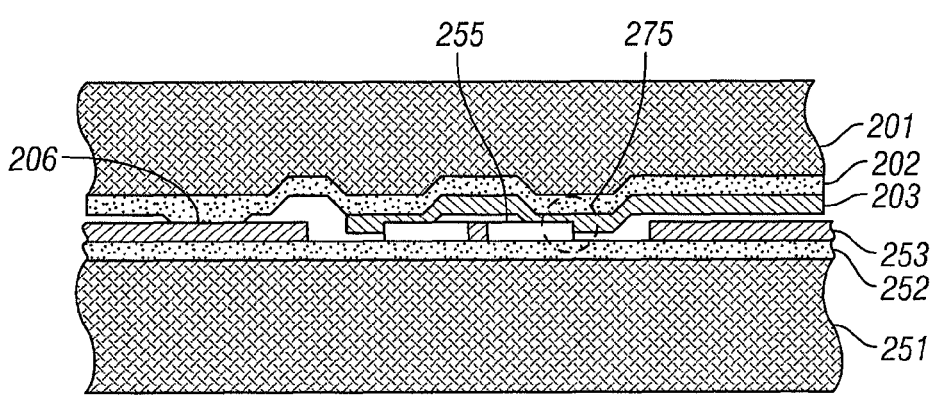
FIG. 3D illustrates the interconnection of the MEMS device of FIG. 3B using the cover of FIG. 3A according to one embodiment of the invention.

FIG. 3D illustrates the joining of the cover 200 with the complex silicon substrate 250. As illustrated in FIG. 3D, terminal 255 engages conductive film conductor 203 at the edges 255A in a "crush-zone" 275. The depth of engagement is limited by a plurality of bond stops, such as bond stop 206, such that conductive film conductor 203 can cross over SOI conductor 253 without making contact. For example, if the contour depth is 1.7 microns, the silicon and metal conductors are 0.5 microns thick, and the bond stops are 0.3 microns thick, then a gap of approximately 1.5 microns will be maintained between conductor 203 and conductor 253. Contouring and gaps tend to be limited by photolithography. By way of illustration, and without limitation, a depth of 2 microns is easier than a depth of 10 microns which requires a thick resist and involves loss of pattern resolution.

The crossings of silicon "fingers" and conductive film "bars" should be of a small area so that the conductive film can be squeezed out of the interface with easily available squeeze forces. The force rises as a very strong function of the area of the interface.

Figure 4A:
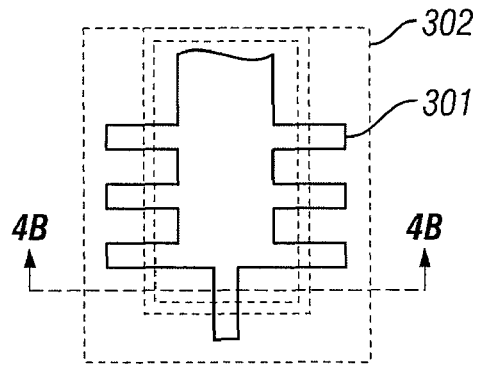
FIG. 4A illustrates an interconnection terminal according to one embodiment of the invention.
Figure 4B:
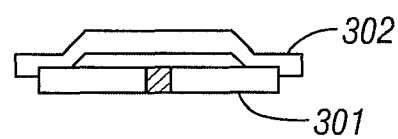
FIG. 4B illustrates the interconnection terminal of FIG. 4A engaged with a cover according to one embodiment of the invention.
Figure 4C:
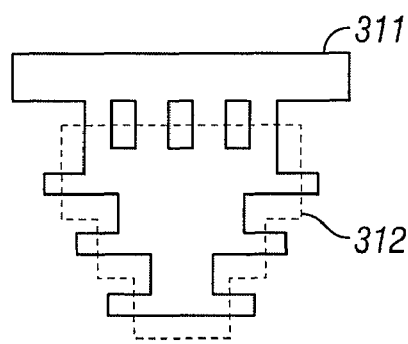
FIG. 4C illustrates an interconnection terminal according to another embodiment of the invention.
Figure 4D:
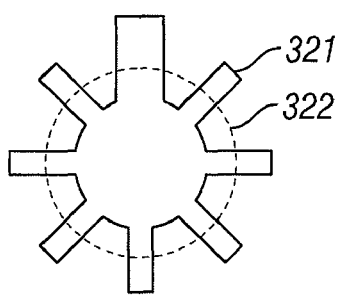
FIG. 4D illustrates an interconnection terminal according to another embodiment of the invention.

FIG. 4A illustrates a top plan view of the engagement of terminal 255 with the footprint of conductor 203 (shown as a dotted line) in one embodiment. FIG. 4B illustrates the same engagement from a side view. Other terminal configurations are possible. As shown in FIG. 4C, the conductor footprint 312 touching the ends of the fingers of 311 should become only a narrow line to cross the bars at the root of the stepped pattern. In another embodiment, as illustrated in FIG. 3D, terminals may have a circular ("daisy") configuration 321 with a corresponding footprint 322 in the mating conductive film conductor. It will be appreciated that many different terminal shapes may be implemented within the scope of the present invention.

Figure 5A:
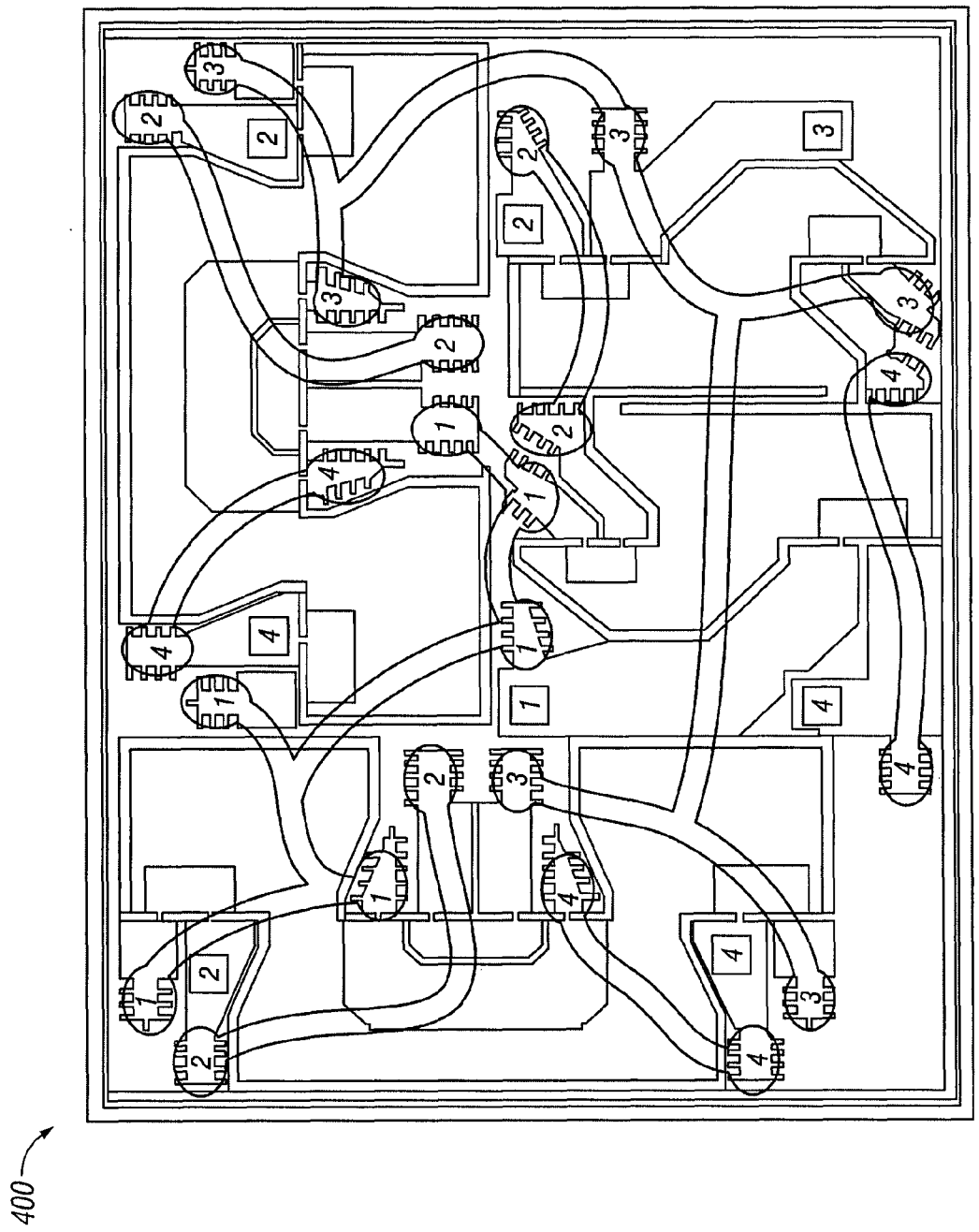
FIG. 5A illustrates an interconnection system on a plane adjacent to a tri-axial MEMS accelerometer according to one embodiment of the invention.

FIG. 5A illustrates a solid-state device 400 according to one embodiment of the present invention. Solid-state device 400 is configured as a triaxial accelerometer similar to solid-state device 100. However, solid-state device 400 is configured with SOI terminals as described above. Also illustrated in FIG. 5A is a metallization pattern for a mating cover showing the pattern of interconnections among the several terminals. The pattern shows the ease with which necessary cross-overs are provided for the in-plane sensors, and the convenience of supplying common power to the three independent sensors.

Figure 5B:
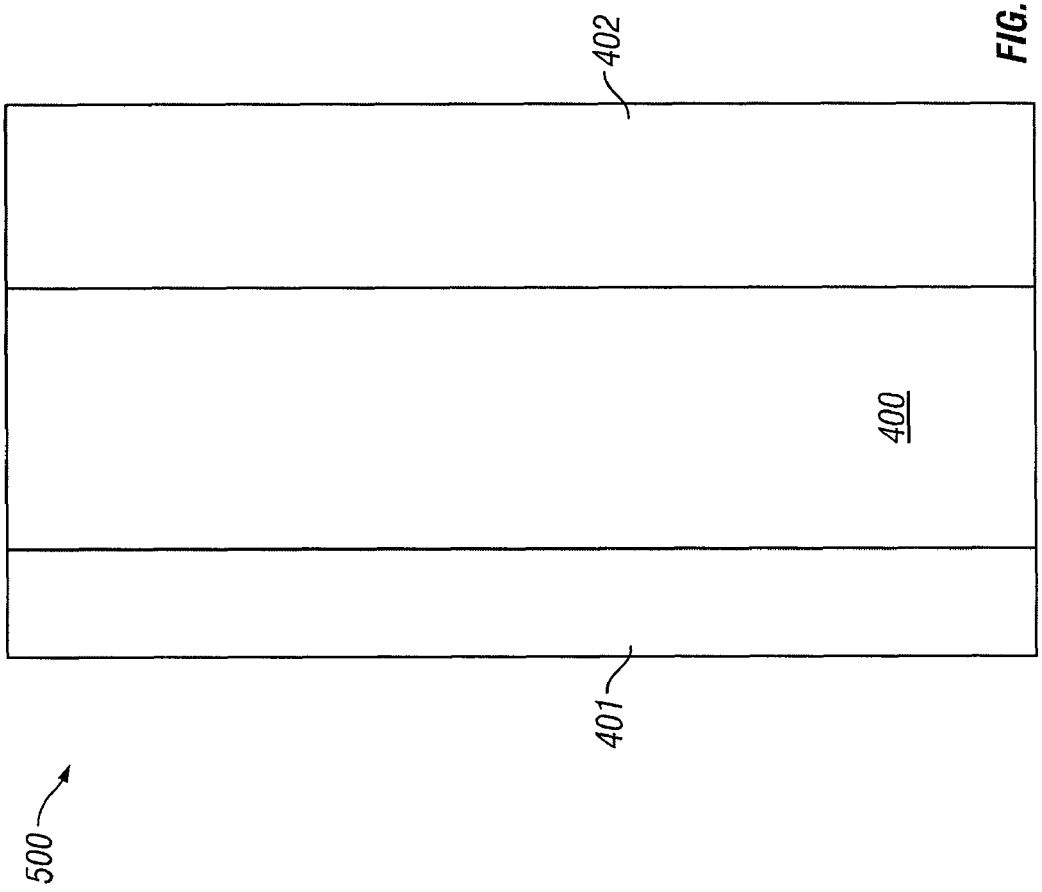
FIG. 5B illustrates a packaged MEMS device according to one embodiment of the invention.

FIG. 5B illustrates an assembly 500, which includes solid-state device 400, a cover 401 including the features of exemplary cover 200, and a base 402 which may be bonded to solid-state device 400 to provide mechanical and thermal stability as is known in the art. FIG. 5B shows three layers, the MEMS 400, the cover 401, and a base 402. The cover and base provide mechanical and environmental protection to the MEMS. The base can be bonded to some larger structure, and usually there is a thermal expansion mismatch between the larger structure and the MEMS. A relatively thick base provides some buffer against this mismatch.

In various embodiments described herein, the inter-wafer connection is a thermo-compression bond between the conductive film on one side and raised small areas of silicon on the other side. This connection scheme works by having the small areas of silicon deform the conductive film, squeezing some conductive film out of the interface to break the conductive film oxide on the conductive film. This gives elemental conductive film access to silicon, with its thinner, less stable oxide. The elemental conductive film attacks the silicon oxide to gain electrical access to the elemental silicon to make the connection.

The interconnection can be made more directly by providing appropriate metal thin films on both surfaces. For example, gold films brought into contact at a few hundred degrees Centigrade will interdiffuse to form a connection and a bond. However, the preparation of the gold films is much more complex. Gold is a poison to the semiconductor functions of silicon, so must be kept from direct contact, by interposing other materials. As a non-limiting example, such a film can be a layer of aluminum to make the semiconductor to metal contact, a layer of titanium nitride as a barrier between aluminum and gold and then the layer of gold to present a clean metallic surface for bonding. Substituting this complex film for simple aluminum is easier on the "wiring" side of the interface. On the device side of the interface, special techniques are required to provide necessary patterning in the presence of the openings through the wafer in a MEMS device.

The present invention can be used when the conductors are outside and are run through a non-conductive seal between layers. In this embodiment, all of the material in layers above their surface is removed in order for them to appear as a pattern of terminals on a porch. This embodiment of a wiring arrangement has particular need for crossovers to bring signal leads from interior bridges over the power busses to the terminals on the porch.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An interconnection system for a MEMS device, comprising:
  a MEMS device with contact points, including,
   a silicon substrate with a face surface that has a pattern of recesses which define functional elements of the MEMS device leaving sharp-edged, highly doped ridges; and
   a cover with a mating surface coupled to the face surface, the cover including patterns of metal films that engage the ridges to form connections from the face surface to the patterns of metal film on the mating surface,
  wherein the MEMS device is an accelerometer and includes one or more seismic masses configured to pivot around pivot axes defined by pivot points between the seismic masses and a body of the silicon substrate.

2. The system of claim 1, wherein the ridges have a doping of at least $10^{19}$ boron atoms/cm$^3$.

3. The system of claim 1, wherein the mating surface is contoured.

4. The system of claim 1, wherein the metal films are made of a material selected from at least one of aluminum, tin, copper, gold and silver.

5. The system of claim 1, wherein the seismic masses are formed in the silicon substrate.

6. The system of claim 1, wherein strain gauges are formed at the pivot points selectively doping the substrate to create piezoresistors that change resistance when the seismic masses pivot under acceleration.

7. The system of claim 1, wherein the sharp edge has a radius of curvature at the edge that is no greater than 0.1 microns.

8. The system of claim 7, wherein the mating surface is contoured in a range of 1 to 3 microns.

\* \* \* \* \*